United States Patent [19]

Raets

[11] Patent Number: 4,642,750

[45] Date of Patent: Feb. 10, 1987

[54] CIRCUIT ARRANGEMENT FOR SWITCHING A CURRENT IN AN INDUCTIVE LOAD

[75] Inventor: Hubert C. Raets, Nieuwenhagen, Netherlands

[73] Assignee: U.S. Philips Corporation, New York, N.Y.

[21] Appl. No.: 757,579

[22] Filed: Jul. 22, 1985

[30] Foreign Application Priority Data

Jul. 26, 1984 [DE] Fed. Rep. of Germany ....... 3427493

[51] Int. Cl.$^4$ ............................................. H02H 7/122
[52] U.S. Cl. ......................................... 363/56; 363/21
[58] Field of Search ...................... 363/18–21, 363/55, 56, 95, 97, 131; 323/282, 285

[56] References Cited

U.S. PATENT DOCUMENTS

| | | | |
|---|---|---|---|
| 3,495,183 | 2/1970 | Doundoulakis et al. | 330/285 X |
| 4,276,588 | 6/1981 | McLyman et al. | 363/56 |
| 4,318,164 | 3/1982 | Onodera et al. | 363/21 |
| 4,489,373 | 12/1984 | du Parc | 363/56 |

OTHER PUBLICATIONS

Ebert et al., "Class E High-Efficiency Tuned Power Oscillator", IEEE Journal of Solid State Circuits, vol. SC-16, No. 2, Apr. 1981, pp. 62–65.

Sokal et al., "Class E–A New Class of High Efficiency Tuned Single-Ended Switching Power Amplifiers", IEEE Journal of Solid State Circuits, vol. SC-10, No. 3, Jun. 1975, pp. 168–176.

*Primary Examiner*—Peter S. Wong
*Attorney, Agent, or Firm*—Robert T. Mayer; Bernard Franzblau

[57] ABSTRACT

A circuit arrangement for switching a current through an inductive load includes at least one semiconductor switch which periodically switches the current through the load at a switching frequency. The main current path of the semiconductor switch is switched alternately to the conductive and to the non-conductive state. The semiconductor switch has a parasitic capacitance and has connected parallel to it a voltage-limiting element for limiting the voltage applied to it. An increase of the switching frequency is attained with simultaneous operation of the circuit arrangement with minimum losses in the semiconductor switch by using a voltage-limiting element (20, 21) which has an inductive input impedance at the switching frequency.

13 Claims, 2 Drawing Figures

CIRCUIT ARRANGEMENT FOR SWITCHING A CURRENT IN AN INDUCTIVE LOAD

This invention relates to a circuit arrangement for switching a current through a load comprising an inductive dummy resistor, in which at least one semiconductor switch periodically switches the current through the load at a switching frequency by alternately switching its main current path to the conductive and the non-conductive state. The semiconductor switch has a parasitic capacitance and has connected parallel to it a voltage-limiting element for limiting the voltage applied to it.

The article "Class E—A New Class of High Efficiency Tuned Single-Ended Switching Power Amplifiers" by Sokal and Sokal, I.E.E.E. Journal of Solid State Circuits, Volume SC-10, No. 3, June 1975, p. 168–176, discloses such a circuit arrangement comprising a switching transistor having its emitter connected to ground potential and its collector connected through a choke coil to the positive terminal of a direct voltage source. A first capacitance serving as voltage-limiting element and a series arrangement of a second capacitance, a further coil and a load resistor are connected parallel to the collector-emitter path of the transistor constituting the main current path of the switching transistor. The transistor is connected by means of its base connection to a driver, by means of which it is switched periodically to the conductive and to the non-conductive state. More particularly when the transistor is switched to the non-conductive state, a voltage occurs at its collector-emitter path which is kept low in the time interval in which the transistor is changed over from the conductive state to the non-conductive state until the current in the collector of the transistor has fully decayed to zero. The first capacitance is moreover defined so that the voltage across the collector-emitter path has again fallen to zero when the transistor is switched for the next time from the non-conductive to the conductive state. Thus, losses in the transistor are avoided and consequently the efficiency of the circuit arrangement is increased.

Proportioning prescriptions for a circuit arrangement of the kind mentioned in the opening paragraph for minimizing power losses in the transistor are known from the article "Class E-High Efficiency Tuned Power Oscillator" by Ebert and Kazimierczuk, I.E.E.E. Journal of Solid-State Circuits, Volume SC-16, No. 2, April 1981, pp. 62–65, more particularly section II. It especially appears from the equations (3) and (9) on page 62 that the value of the first capacitance has to be chosen inversely proportional to the switching frequency in order to obtain minimum power dissipation in the transistor. For high switching frequencies, a very small value for the first capacitance has therefore to be chosen.

In a transistor, but also in other semiconductor switches, a parasitic capacitance is generally formed parallel to the main current path. This capacitance has to be taken into account, especially for high switching frequencies, in choosing the value of the first capacitance because it is connected parallel thereto. In this case there is an upper limit value of the switching frequency at which the parasitic capacitance of the semiconductor switch itself takes over the function of the first capacitance, if always a proportioning of the circuit arrangement for minimum losses in the semiconductor switch is a requirement. With a further increase of the switching frequency above this limit value, operation of the circuit arrangement with minimum losses in the semiconductor switch can then be attained no longer.

The invention has for an object to provide such a construction for a circuit arrangement of the kind mentioned in the opening paragraph that it can be used for the application of semiconductor switches resistant to high voltages and having large parasitic capacitances parallel to the main current path at switching frequencies above its upper limit value.

According to the invention, this object is achieved in that at the switching frequency the voltage-limiting element has an inductive input resistance. The combination of the parasitic capacitance and the voltage-limiting element then has a capacitance value which is reduced with respect to the parasitic capacitance and can be fixed by adjustment of the inductive reactance of the voltage-limiting element in such a manner that the power dissipation in the semiconductor switch becomes a minimum. Thus, it is possible to considerably enlarge the range within which the value of the switching frequency can be adjusted towards high frequencies and with power dissipation remaining low in comparison with low values of the switching frequency, and hence with high efficiencies. Thus, it is possible to choose for the elements of the circuit arrangement according to the invention a construction which is smaller, lighter and less expensive.

It should be noted here that U.S. Pat. No. 3,495,183 discloses an alternating current amplifier comprising field effect transistors which have parasitic capacitances parallel to their main current paths, and in which series arrangements each comprising an inductive element and a capacitor are connected parallel to the main current paths and hence to the parasitic capacitances. The inductive element comprises a ferrite core having a permeability which varies inversely to the square of the operating frequency of the alternating current amplifier and forms, with the associated parasitic capacitance, a resonant circuit which is always tuned to resonance in a given frequency range in which the operating frequency varies, and thus always constitutes an ohmic impedance. Thus, the effect of the parasitic capacitance of the respective field effect transistor is fully eliminated at all of the operating frequencies of the amplifier which occur.

According to a further embodiment of the invention, the voltage-limiting element comprises a series arrangement of an inductive element and a capacitor. The capacitor mainly serves to prevent a direct current short-circuit through the inductive element, while the input impedance of the voltage-limiting element is mainly determined by the inductive element.

According to another embodiment of the invention, the inductive element comprises a section of a current lead. Such a circuit arrangement is advantageously utilized at high switching frequencies. Such an inductive element can then be proportioned simply and accurately by adaptation of the dimensions, for example of the length of the lead. According to a further advantageous embodiment, such a lead has a preferably strip-shaped coating which, for example, is formed on a platform together with the remaining conductive connections for the circuit arrangement and can be commonly obtained.

In order that the invention may be readily carried out, it will now be described more fully, by way of example, with reference to the accompanying drawing, in which.

Figure 1:
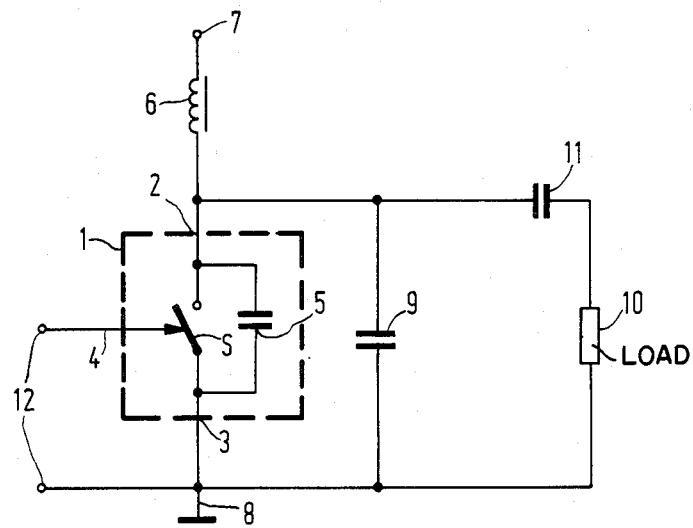
FIG. 1 shows a circuit arrangement according to the prior art.

FIG. 1 shows diagrammatically a generalization of a circuit arrangement known from the said article by Sokal and Sokal. In this circuit arrangement, a semiconductor switch 1 is represented diagrammatically by a main current path which is formed between two connections 2 and 3 and can be switched by a switch S to the conductive and to the cut-off state. The switch S is changed over through a control terminal 4. A parasitic capacitance 5 is connected parallel to the switch S. In the said article by Sokal and Sokal, the semiconductor switch 1 is constituted by a bipolar npn transistor whose collector constitutes the first of the two connections 2, whose emitter constitutes the second of the two connections 3 and whose base constitutes the control terminal 4. The semiconductor layers of the transistor that can be switched to the conductive and to the non-conductive state constitute the switch S and the collector-emitter capacitance constitutes the parasitic capacitance 5.

In the circuit arrangement of FIG. 1, the first connection 2 is connected through a choke coil 6 to the positive terminal 7 of a direct voltage source, while the second connection 3 is connected to a ground connection 8 applied to ground potential. A first capacitance 9 forming a voltage-limiting element and an inductive load 10 (comprising a discharge lamp) are connected parallel to the semiconductor switch 1. The load 10 comprises an inductive and an ohmic resistance component and is connected in series with a second capacitance 11. Through two input terminals 12, one of which is connected to the ground connection 8 and a second is connected to the control terminal 4 of the semiconductor switch 1, the circuit arrangement receives a control voltage for changing over the semiconductor switch 1 to the conductive or to the non-conductive state.

When proportioning the circuit arrangement of FIG. 1, the influence of the parasitic capacitance in the semiconductor switch 1 gradually increases, especially at high switching frequencies of the control voltage supplied via the input terminals 12, and has to be taken into account when choosing the value of the first capacitance 9. The value of the first capacitance can be chosen so that its sum with the value of the parasitic capacitance 5 just corresponds to the value to be chosen for the capacitance of the voltage-limiting element for minimum losses in the semiconductor switch 1. If, when reaching the upper limit value for the switching frequency, this value becomes equal to the value of the parasitic capacitance 5, the first capacitance 9 may theoretically be dispensed with. In the case of a further increase of the switching frequency, however, operation of the circuit arrangement with a minimum power dissipation is no longer possible because even the value of the parasitic capacitance 5 alone represents too large a capacitance value for the voltage-limiting element.

Figure 2:
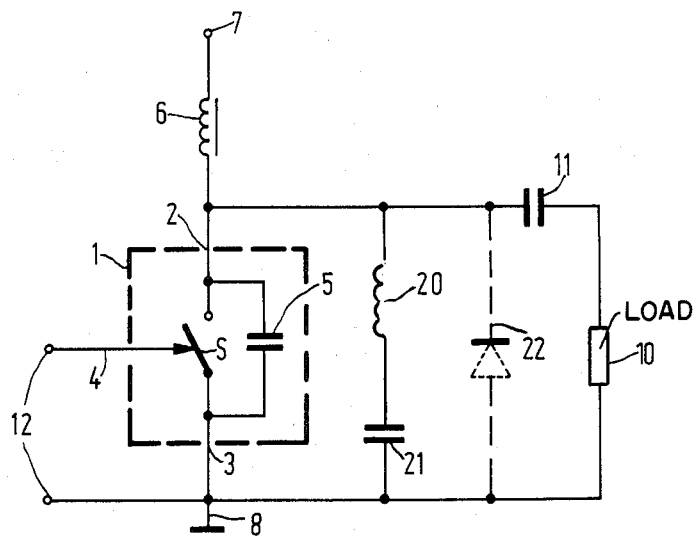
FIG. 2 shows a first embodiment of the invention.

FIG. 2 shows an embodiment of a circuit arrangement according to the invention, in which parts corresponding to FIG. 1 are designated by like reference symbols and are described in the same way as in FIG. 1. The first capacitance 9 used in FIG. 1 as a voltage-limiting element is replaced in the circuit arrangement of FIG. 2 by a series arrangement of an inductive element 20 and a capacitor 21, which are proportioned so that the impedance of the inductive element is predominant at the switching frequency with respect to the impedance of the capacitor 21. Consequently, the capacitor 21 mainly prevents a direct current shortcircuit between the positive terminal 7 of the direct voltage source and the ground connection 8. The inductive element 20 forms, together with the parasitic capacitance 5, an arrangement acting as a new voltage-limiting element and having a capacitance value reduced with respect to the parasitic capacitance 5.

In the circuit arrangement of FIG. 2, the semiconductor switch 1 may have a diode 22 connected parallel to it. The diode 22 prevents the first connection 2 of the semiconductor switch 1 from assuming a negative potential with respect to the ground connection 8 and which consequently dissipates voltage peaks and hence overshoot pulses.

In the circuit arrangement according to the invention, the semiconductor switch 1 may be constructed as a bipolar transistor of the npn or of the pnp type, as a field effect transistor, as a thyristor device or in a similar manner. Combinations of such semiconductor switches, for example, a series arrangement of a bipolar transistor and a field effect transistor (BIMOS), may also be used as the semiconductor switch 1. The main current path of these switches is then each time to be arranged between the connections 2 and 3, while its control electrodes (for example base or gate connections) are to be connected to the control terminal 4. With the use of a series arrangement of, for example, a bipolar transistor and a field effect transistor, the bipolar transistor is then connected by its collector to the first connection 2 and by its emitter to the drain connection of the field effect transistor, whose source contact is connected to the ground connection 8. The base of the bipolar transistor is connected through a bias voltage capacitor to the ground connection 8, while the control terminal 4 is connected to the gate connection of the field effect transistor.

What is claimed is:

1. A circuit arrangement for switching a current through a load which comprises an inductive component and a resistive component, comprising at least one semiconductor switch that periodically switches the current through the load at a switching frequency by means of its main current path switched alternately to the conductive and the non-conductive state, the semiconductor switch having a parasitic capacitance, a voltage-limiting element connected in parallel with the semiconductor switch for limiting the voltage applied to said switch, characterized in that the voltage-limiting element has an inductive input impedance at the switching frequency.

2. A circuit arrangement as claimed in claim 1, characterized in that the voltage-limiting element comprises a series arrangement of an inductive element and a capacitor.

3. A circuit arrangement as claimed in claim 1, characterized in that the inductive element comprises a section of a lead.

4. A circuit for switching current in a load having an inductive impedance component comprising: a pair of DC supply voltage terminals, at least one semiconductor switching device coupled to said supply voltage terminals and to the load so as to switch a current through the load at a switching frequency, the semiconductor switching device and the load being connected in parallel to said DC supply voltage terminals and said semiconductor switching device having a parasitic capacitance, voltage-limiting means connected in parallel with the semiconductor switching device for limiting the voltage applied to said switching device, wherein the voltage-limiting means comprise an inductor and a capacitor connected in a series circuit and having a net inductive impedance at the switching frequency, and means for applying a switching signal at the switching frequency to a control electrode of the semiconductor switching device.

5. A circuit as claimed in claim 4 wherein the switching device comprises a transistor and the inductance and capacitance values of the inductor and capacitor of the voltage-limiting means are chosen so as to effectively reduce the value of the parasitic capacitance at said switching frequency.

6. A circuit as claimed in claim 4 further comprising a second inductor connected in series with the switching device across the DC supply voltage terminals and a second capacitor for coupling the load in parallel with the semiconductor switching device.

7. A circuit as claimed in claim 6 wherein the second capacitor is connected between one terminal of the load and a junction point between the second inductor and the semiconductor switching device.

8. A circuit as claimed in claim 4 wherein the load includes an electric discharge lamp.

9. A circuit as claimed in claim 4 wherein the semiconductor switching device comprises a bipolar transistor and the parasitic capacitance comprises the collector-emitter capacitance of the transistor.

10. A circuit for switching current in a load having an inductive impedance component comprising: a transistor switch, a source of DC supply voltage coupled to the load and to the transistor switch such that the transistor switch periodically switches a current to the load at a switching frequency, said transistor having a parasitic capacitance in parallel therewith, voltage-limiting means connected in parallel with the transistor for limiting the voltage applied to said transistor, said voltage-limiting means having a net inductive impedance at said switching frequency thereby to reduce the effective capacitance of said parasitic capacitance.

11. A circuit as claimed in claim 10 further comprising a capacitor coupling the load in parallel with the transistor to said source of DC supply voltage.

12. A circuit as claimed in claim 10 wherein the voltage-limiting means comprise an inductor and a capacitor connected in a series circuit.

13. A circuit as claimed in claim 10 wherein the voltage-limiting means is operative to reduce power dissipation in the transistor and includes an inductor to extend the upper end of the transistor switching frequency range to a frequency beyond the effective frequency limit otherwise dictated by the parasitic capacitance of the transistor while still maintaining reduced power dissipation in the transistor.

* * * * *